(12) United States Patent
Eto (10) Patent No.: US 7,723,202 B2
(45) Date of Patent: May 25, 2010

(54) METHOD FOR MANUFACTURING A SEMICONDUCTOR DEVICE INCLUDING A CROWN-TYPE CAPACITOR

(75) Inventor: Toyonori Eto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 275 days.

(21) Appl. No.: 11/825,335

(22) Filed: Jul. 6, 2007

(65) Prior Publication Data

US 2008/0009119 A1 Jan. 10, 2008

(30) Foreign Application Priority Data

Jul. 7, 2006 (JP) .............................. 2006-187365

(51) Int. Cl.
 *H01L 21/20* (2006.01)
(52) U.S. Cl. ................................ 438/396; 257/E21.648
(58) Field of Classification Search ................ 438/396; 257/E21.648
See application file for complete search history.

(56) References Cited

U.S. PATENT DOCUMENTS 7,071,071 B2 * 7/2006 Iijima et al. ................ 438/396

FOREIGN PATENT DOCUMENTS

| JP | 2005-150747 | | 6/2005 |
|---|---|---|---|
| JP | 2005-150747 | * | 9/2005 |

* cited by examiner

*Primary Examiner*—Matthew C Landau
*Assistant Examiner*—Vicki B Booker
(74) *Attorney, Agent, or Firm*—Scully, Scott, Murphy & Presser, P.C.

(57) ABSTRACT

A method for forming a semiconductor device includes a plurality of crown-type capacitors in a capacitor-receiving insulating film, wherein bottom electrodes of the capacitors have an insulating spacer between each two of the bottom electrodes. The insulating spacer is formed by removing a hard mask used as an etching mask for forming cylindrical holes receiving therein capacitors including the bottom electrodes.

7 Claims, 10 Drawing Sheets

METHOD FOR MANUFACTURING A SEMICONDUCTOR DEVICE INCLUDING A CROWN-TYPE CAPACITOR

This application is based upon and claims the benefit of priority from Japanese patent application No. 2006-187365, the disclosure of which is incorporated herein in its entirety by reference.

BACKGROUND OF THE INVENTION

1. Field of the Invention

The present invention relates to a method for manufacturing a semiconductor device including a crown-type capacitor.

2. Description of the Related Art

Higher integration of memory cells has been desired in a semiconductor memory device, such as DRAM device (Dynamic Random Access Memory). In order to achieve the higher integration of the memory cells, it is necessary to increase the capacitance per the area which each cell capacitor of the memory cells occupies. One of the techniques for obtaining a higher capacitance for the cell capacitors is to form crown-type capacitors in the memory cell area. For forming the crown-type capacitors, a bottom electrode film is formed along the bottom and sidewall of cylindrical through-holes formed in a thick insulated film, referred to as cylinder-receiving film in this text, followed by removing the thick insulation film to thereby leave cylindrical bottom electrodes.

The capacitance of the crown-type capacitors may be increased by increasing the height of the cylindrical bottom electrodes to increase the surface area of the bottom electrodes. However, there occurs a problem in the conventional technique that the bottom electrodes are liable to incline and collapse toward the adjacent bottom electrodes along with the increase of the height of the bottom electrodes, thereby causing a short-circuit failure.

A technique for forming a spacer ring, or insulating spacer, in the vicinity of the top of the bottom electrodes is proposed to solve the above problem of the short-circuit failure. The insulating spacer formed in the vicinity of the top of the bottom electrodes prevents the short-circuit failure even in the case of inclination or collapse of the bottom electrodes. The technique for forming the insulating spacers is described in, for example, Patent Publication JP-2005-150747A.

The process, described in the above publication, for forming the insulating spacers includes the steps of forming a bottom electrode film on the bottom and sidewall of cylindrical holes, and embedding an insulating film in the cylindrical holes with an intervention of the bottom electrode film. After removing the surface portion of the wafer as a whole to divide the bottom electrode film into a plurality of bottom electrodes, the upper portion of the cylinder-receiving film and the embedding insulating film is etched for removal thereof, to form a step difference between the remaining portion of the insulating films and top of the bottom electrodes.

An insulating spacer film is then deposited to cover the step difference on the wafer, followed by etch-back thereof to leave the insulating spacers along the inner and outer surfaces of the bottom electrode. Subsequently, the cylinder-receiving film and embedding insulating film are removed to expose the cylindrical bottom electrode.

The technique as described above provides the insulating spacers on the inner side and outer side of the cylindrical bottom electrodes, because the top portion of both the cylinder-receiving film and embedded film is removed during forming the step difference. The insulating spacers formed inside the cylindrical bottom electrodes reduces the inner diameter of the opening of the cylindrical bottom electrodes, thereby causing an obstacle against forming the capacitor insulator film on the inner surface of the cylindrical bottom electrodes.

SUMMARY OF THE INVENTION

In view of the above problem of the present invention, it is an object of the present invention to provide a method for manufacturing a semiconductor device including crown-type capacitors, which are capable of preventing a short-circuit failure between the bottom electrodes of the capacitors and allowing the capacitor insulation film to be formed without an obstacle by the insulating spacers.

The present invention provides a method for manufacturing a semiconductor device comprising: forming a first insulating film overlying a semiconductor substrate; forming a mask pattern on the first insulating film; anisotropic-etching the first insulating film by using the mask pattern as an etching mask, to form a plurality of through-holes in the first insulating film; depositing a bottom electrode film on bottom and sidewall of the through-holes and on top of the mask pattern; depositing a second insulating film on the bottom electrode film to fill the through-holes, the second insulating film having a substantially flat surface; removing a top portion of the bottom electrode film and the second insulating film, to thereby separate the bottom electrode film into a plurality of bottom electrodes; removing the mask pattern to form a level difference between the first insulating film and a top of the bottom electrodes or second insulating film; depositing a third insulating film covering the first insulating film, the second insulating film and the bottom electrodes; etching-back the third insulating film to leave a plurality of insulating spacers on the respective bottom electrodes; removing the first and second insulating films; and depositing a capacitor insulation film and a top electrode film on the bottom electrodes and the insulating spacers to form a plurality of capacitors.

The above and other objects, features and advantages of the present invention will be more apparent from the following description, referring to the accompanying drawings.

PREFERRED EMBODIMENT OF THE INVENTION

Now, an exemplary embodiment of the present invention and modifications thereof will be described with reference to accompanying drawings, wherein similar constituent elements are designated by similar reference numerals throughout the drawings.

Figure 1:
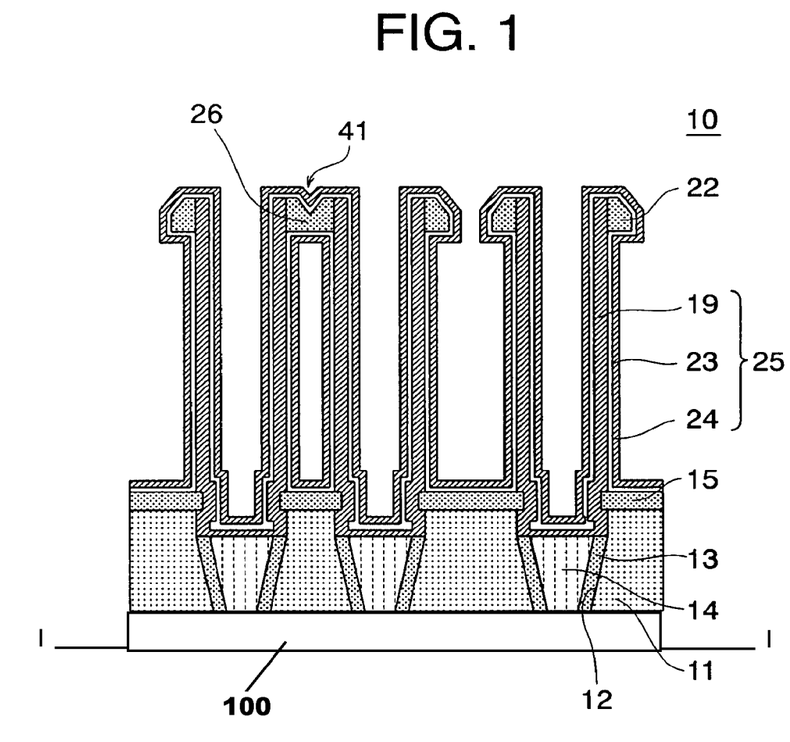
FIG. 1 is a vertical sectional view showing a semiconductor device manufactured by a process according to an embodiment of the present invention.

FIG. 1 shows a semiconductor device manufactured by a process according to an embodiment of the present invention. The semiconductor device 10 is configured as a DRAM device including MOS transistors (not shown) formed in the surface region of a semiconductor substrate 100 and an overlying structure shown in FIG. 1. The overlying structure shown in FIG. 1 includes an interlevel dielectric film 11, which overlies MOS transistors formed on the semiconductor substrate 100. The interlevel dielectric film 11 may include a plurality of insulation layers (not shown), between which bit lines are interposed. An etch stop film 15 configured by a silicon nitride film is disposed on the interlevel dielectric film 11.

The etch stop film 15 and interlayer dielectric film 11 receive therein contact holes 12, which expose therethrough source/drain regions of MOS transistors. Thin sidewall protective films 13 configured from a silicon nitride film are formed on the sidewall of the contact holes 12. Contact plugs 14 made of polysilicon are formed on the sidewall protective film 13 within the contact holes 12. The sidewall protective film 13 has a function of suppressing a short-circuit failure from occurring between the contact plugs 14 and the bit lines. The contact plugs 14 may be made of titanium nitride, tungsten, etc.

Bottom electrodes 19 made of titanium nitride are formed on top of the sidewall protective film 13 and contact plugs 14. The bottom electrodes 19 have a shape of cylinder having a top opening and a closed bottom, which protrudes toward the top portion of the contact holes 12. The bottom electrodes 19 are provided with respective insulating spacers 22 which are formed on the outer periphery of the top portion of the bottom electrodes 19. The insulating spacers 22 are made of, for example, silicon nitride.

A capacitor insulation film 23 is formed to cover the exposed surface of the bottom electrodes 19 and insulating spacers 22, and a top electrode film 24 is formed to cover the exposed surface of the capacitor insulation film 23. The capacitor insulation film 23 is made of a material having a high dielectric constant, such as $Al_2O_3$, $Ta_2O_5$, $HfO_2$ and $ZrO_2$. The bottom electrodes 19, capacitor insulation film 23, and top electrode film 24 configure a plurality of crown-type capacitors 25. The capacitors 25 are covered by an interlevel dielectric film (not shown), on which overlying interconnections are formed to connect to the top electrode film 24.

Figure 2:
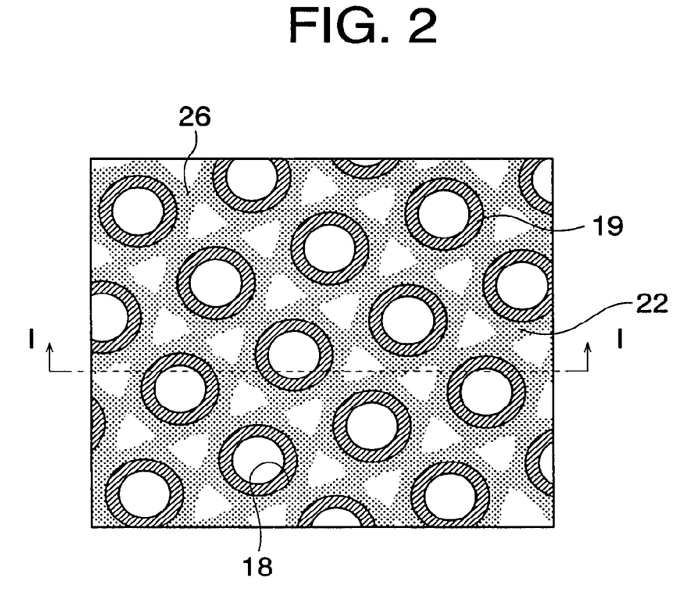
FIG. 2 is a horizontal sectional view showing bottom electrodes and insulating spacers formed in the semiconductor device of FIG. 1.

FIG. 2 shows a horizontal sectional view of the semiconductor device of FIG. 1, depicting the arrangement of the bottom electrodes 19 and insulating spacers 22. FIG. 1 corresponds to a sectional view taken along line I-I in FIG. 2. The insulating spacers 22 are configured as spacer rings encircling the bottom electrodes 19. The insulating spacers 22 are associated with bridge portions 26 for coupling together adjacent two of the spacer rings. The insulating spacers 22 and bridge portions 26 are configured from a single insulating spacer film. This structure enforces the mechanical strength of the bottom electrodes 19 and prevents the bottom electrodes 19 from being inclined and collapsed. The insulating spacer film is not formed on the inner wall of the bottom electrodes 19, whereby the capacitor insulation film can be formed on the bottom electrodes 19 without an obstacle.

FIGS. 3A to 3H show consecutive steps of a fabrication process for manufacturing the semiconductor device of FIG. 1. MOS transistors are formed in the surface region of a semiconductor substrate (not shown). Subsequently, MOS transistors including the gate electrodes thereof are covered by an interlayer dielectric film 11 deposited using a CVD technique. The interlayer dielectric film 11 includes a plurality of layers, between which bit lines etc. are formed.

Figure 3A:
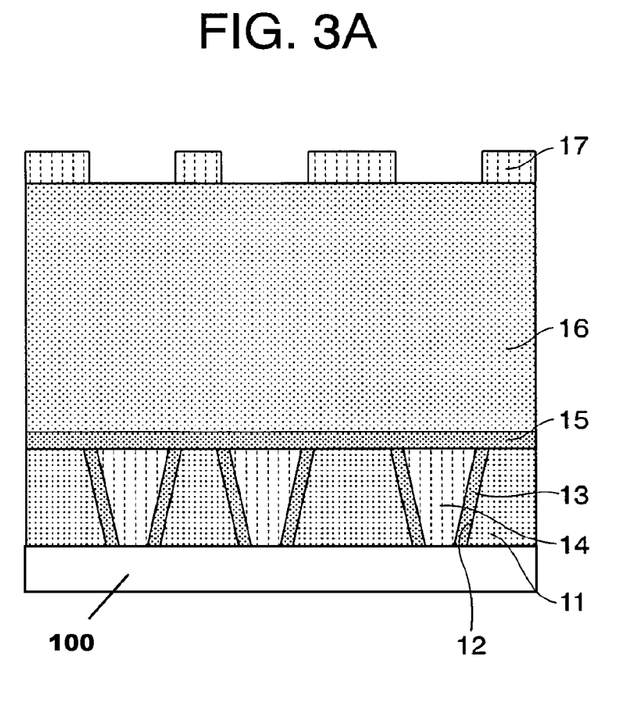
FIGS. 3A to 3H are vertical sectional views of the semiconductor device FIG. 1, showing consecutive fabrication steps of the process for manufacturing the semiconductor device.

Subsequently, contact holes 12 which penetrate the interlayer dielectric film 11 are formed by using an anisotropic etching technique. In this step, a surface portion of the semiconductor substrate configuring source/drain regions of the MOS transistors is exposed. After forming the sidewall protective film 13 made of silicon nitride on the sidewall of the contact holes 12, contact plugs 14 made of polysilicon are formed on the sidewall protective film 13 in the contact holes 12.

Subsequently, a thin etch stop film 15 made of silicon nitride is deposited using an evaporation technique onto the interlayer dielectric film 11, sidewall protective film 13, and contact plugs 14. Thereafter, a thick insulating film 16 made of silicon oxide is deposited using a plasma-enhanced CVD technique as a capacitor-receiving film. The capacitor-receiving film 16 has a thickness of 2.2 micrometers, for example.

Subsequently, another film to be formed as a hard mask is deposited using a CVD technique onto the thick insulating film 16. The another film has a higher etch rate compared to the thick insulating film 16, bottom electrodes 19, and an embedding film, which will be described later, in a specific etching condition. The another film also has a higher temperature resistance at the temperature for heat treating the bottom electrodes 19. The another film may be a polysilicon or amorphous carbon film, for example.

If polysilicon is used as the another film or hard mask film, the another film may preferably have a thickness of 350 to 500 nm, and if amorphous carbon is used as the another film, the another film may preferably have a thickness of 800 nm. Thereafter, the another film is patterned using a photolithographic process to configure the hard mask 17, as shown in FIG. 3A.

Figure 3B:
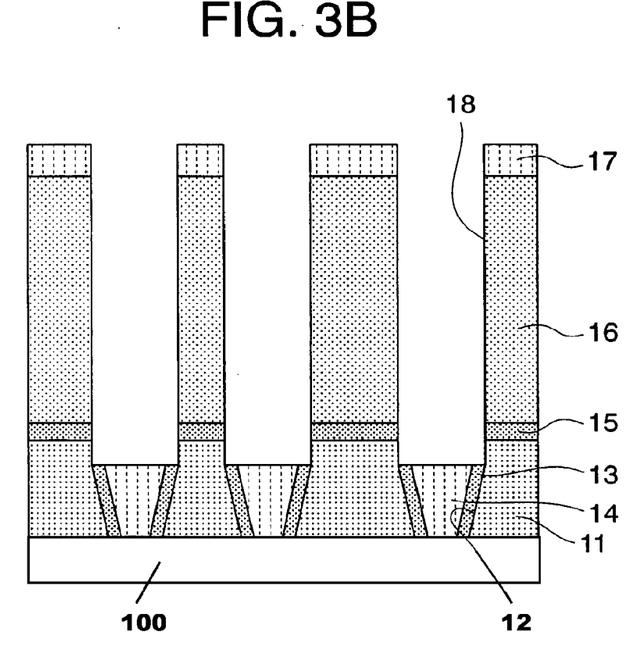

Subsequently, anisotropic etching of the capacitor-receiving film 16 and etch stop film 15 is performed by using the hard mask 17 as an etching mask, to form cylindrical through-holes 18 which expose the sidewall protective films 13 and contact plugs 14, as shown in FIG. 3B. The top portion of the sidewall protective film 13 and contact plugs 14 is removed during forming the cylindrical through-holes 18. In addition, the upper part of the hard mask 17 is also etched during the etching to have a reduced thickness of about 170-120 nm.

Figure 3C:
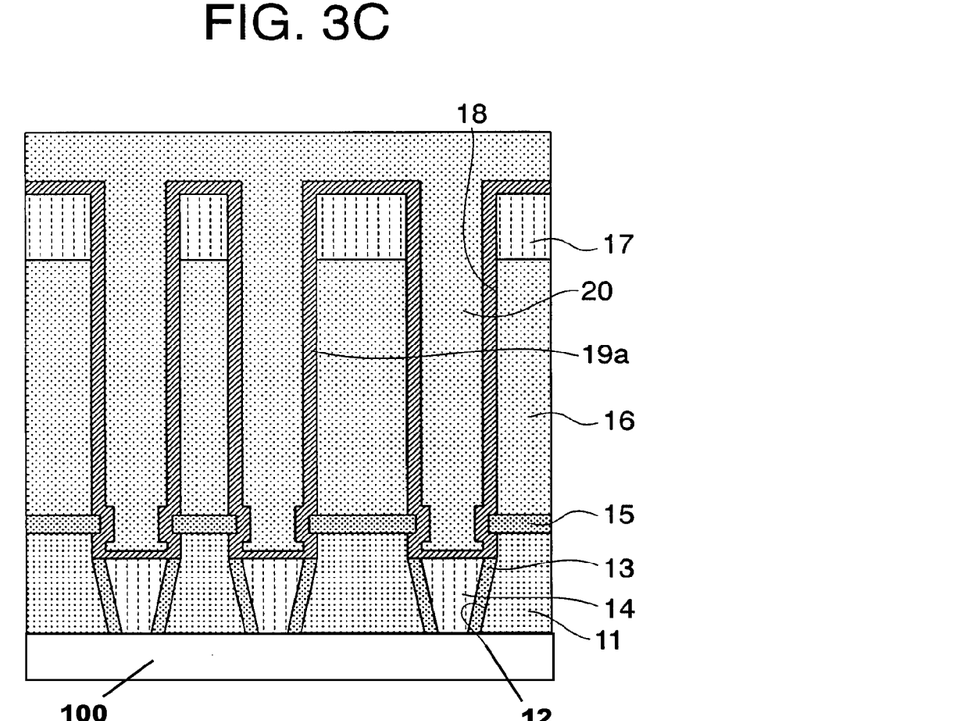

Thereafter, a bottom electrode film 19a including titanium nitride is formed on the bottom and sidewall of the cylindrical through-holes 18 as well as on the hard mask 17. Polysilicon or precious metals, such as ruthenium, may be used for the bottom electrode film 19a instead of titanium nitride. Subsequently, onto the bottom electrode film 19a, the embedding film 20 including NSG (Non-doped Silicate Glass) is deposited to fill the cylindrical through-holes 18 via the bottom electrode film 19a, as shown in FIG. 3C.

Figure 3D:
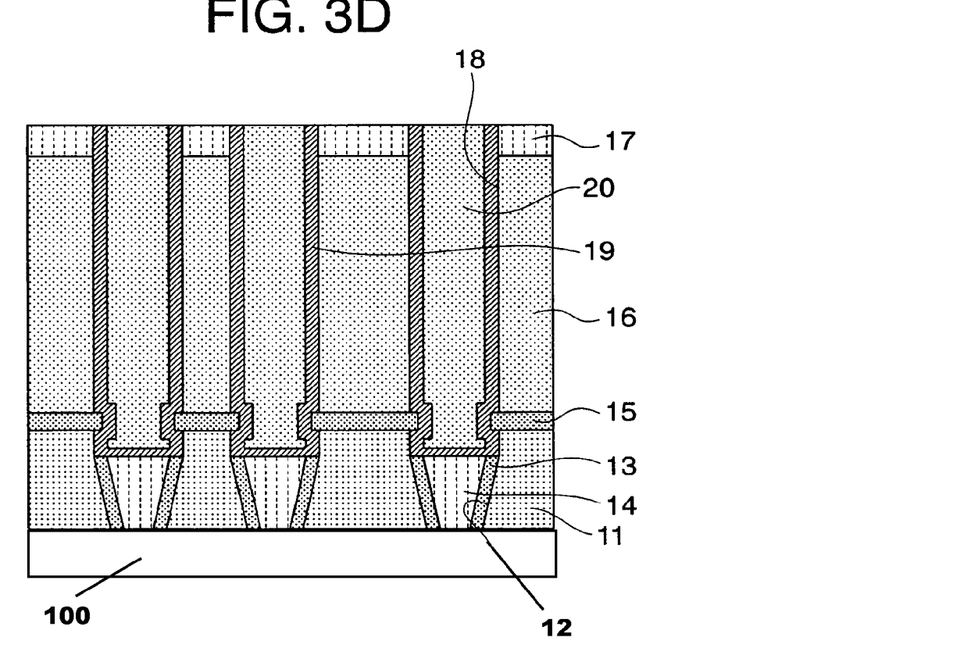

Thereafter, a portion of the bottom electrode film 19a deposited on the hard mask 17 is removed using an etch-back technique, together with the upper portion of the embedding film 20 and surface portion of the hard mask 17, as shown in FIG. 3D. The etch-back process may use a CMP (Chemical Mechanical Polishing) technique. This process separates the bottom electrode film 19a into a plurality of cylindrical bottom electrodes 19 to be provided in the respective capacitors. The thickness of the remaining part of the hard mask 17 is adjusted to 50-60 nm by controlling the amount of etch-back.

Figure 3E:
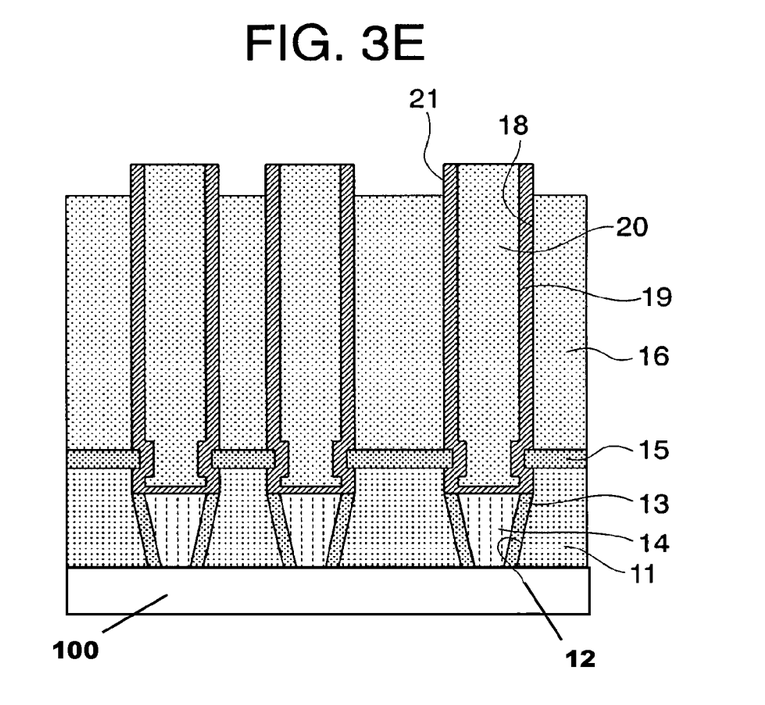

Subsequently, the exposed hard mask 17 is removed by etching under the condition of a high etch selectivity for the hard mask 17 with respect to the bottom electrodes 19 and embedding film 20. If polysilicon is used for the hard mask 17, fluorine-including etching gas may be used, for example, for the etching, whereas if amorphous carbon is used for the hard mask, oxygen plasma may be used, for example. Removal of the hard mask 17 leaves a step or level difference 21 between the top of the capacitor-receiving film 16 and the top of the bottom electrodes 19 or embedding films 20, as shown in FIG. 3E. The resultant height of the step 21 or level difference is equal to the thickness of the then-remaining part of the hard mask 17, which is 50-60 nm.

Figure 3F:
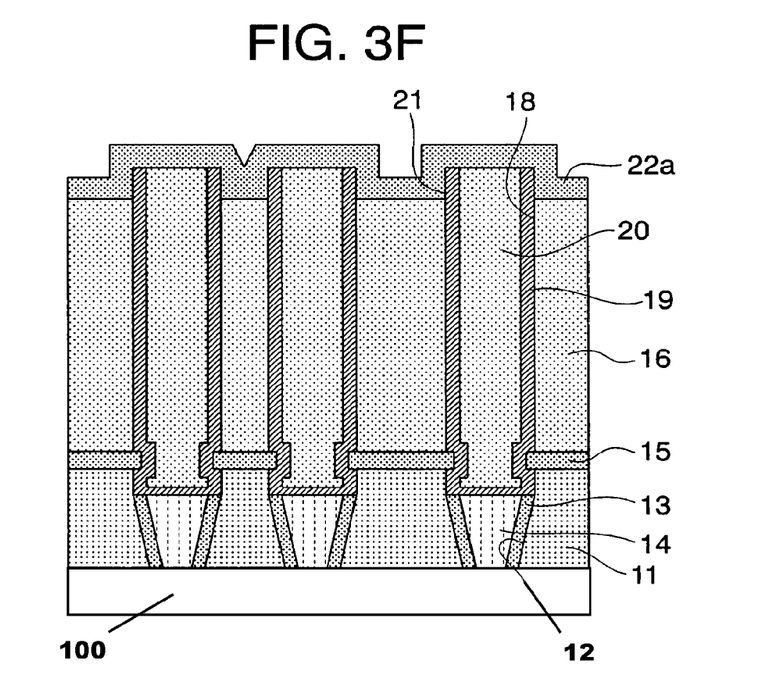
Figure 3G:
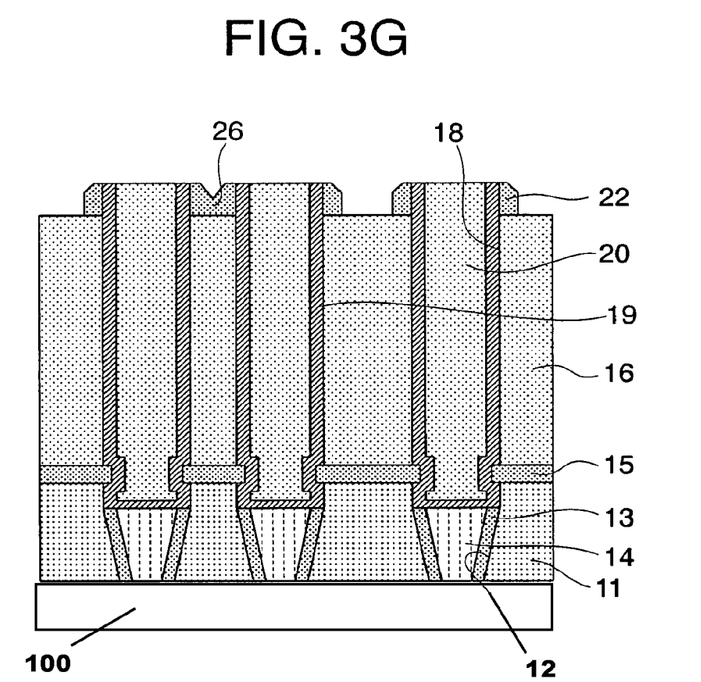
Figure 3H:
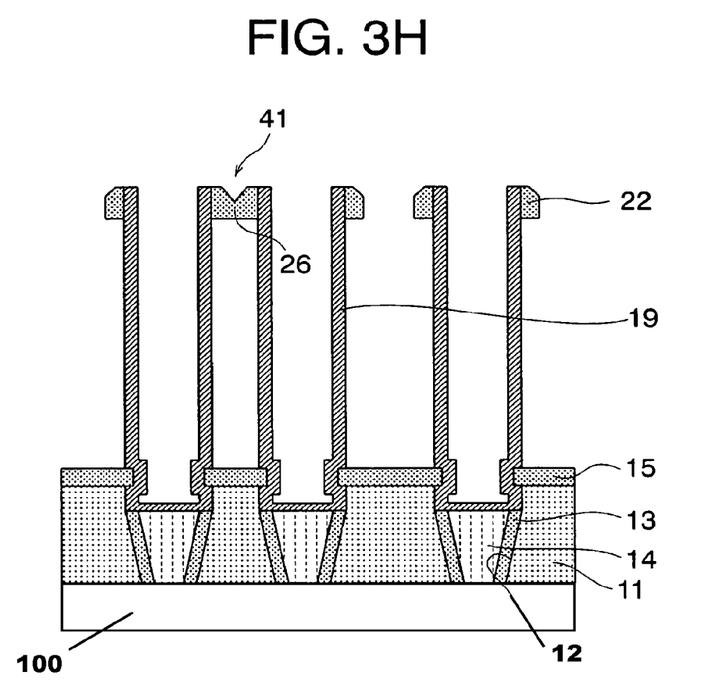

Subsequently, an insulating spacer film 22a, which is to be formed as the spacers 22, is deposited on the capacitor-receiving film 16, bottom electrodes 19, and embedding film 20, as shown in FIG. 3F. A silicon nitride film can be used for the insulating spacer film 22a, for example. The insulating spacer film 22a is then subjected to etch-back to form the insulating spacers 22 encircling the top portion of the bottom electrodes 19, as shown in FIG. 3G. The insulating spacers 22 have a thickness corresponding to the height of the step 21 which is 50-60 nm. Thereafter, wet etching is conducted to remove the capacitor-receiving film 16 and embedding film 20, thereby exposing the inner and outer surfaces of the bottom electrodes 19, as shown in FIG. 3H.

Subsequently, the capacitor insulation film 23 is deposited to cover the exposed surface of the bottom electrodes 19 and insulating spacers 22, followed by forming the top electrode film 24 on the exposed surface of the capacitor insulation film 23. Thus, the crown-type capacitors 25 including the bottom electrodes 19, capacitor insulation film 23, and top electrode film 24 are obtained, as shown in FIG. 1. Thereafter, the semiconductor device 10 is finalized by forming interconnection layers and interlevel dielectric films overlying the capacitors 25.

It is to be noted that, for obtaining effective bridge portions 26, it is generally preferable to allow the height of the step 21 to be larger than the gap distance between adjacent cylindrical holes 18, and thus a height of 50-60 nm is used in a 80-nm-rule DRAM device, i.e., a DRAM device manufactured using an 80 nm design rule. This configuration is adopted in consideration that removal of the capacitor-receiving film 16 and embedding film 20 in the step of FIG. 3H as well as the deposition of the capacitor insulation film 23 and top electrode film 24 premises a large distance between the openings of the insulating spacers 22, which is subjected to the etch-back in the step of FIG. 3G. In the present embodiment, the height of the step 21 can be adjusted with ease by controlling the amount of etch-back in the step of FIG. 3D.

As described in the method of the present embodiment, the above step 21 is formed between the capacitor-receiving film 16 and the bottom electrodes 19 or the embedding film 20 by removing the hard mask 17 formed on the capacitor-receiving film 16. This allows the insulating spacers 22 to be formed only on the outer side of the bottom electrodes 19. The process of forming the step 21 uses the hard mask 17 and thus does not include an additional photolithographic step as compared to the case of the conventional technique having no insulating spacers.

A larger thickness of the insulating spacers 22 generally achieves a larger mechanical strength; however, an excessively larger thickness may incur peel-off of the insulating spacers 22 from the bottom electrodes 19 and a reduced mechanical strength of the bridge portions of the insulating spacers 22. In the present embodiment the thickness of the insulating spacers 22 can be controlled with ease by controlling the amount of etch-back of the deposited hard mask 17 to control the remaining thickness of the hard mask 17. Accordingly, the method of the present embodiment suppresses degradation in the coverage performance of the capacitor insulation film 23 and top electrode film 24, and yet achieves insulating spacers 22 having a superior mechanical strength.

Figure 4:
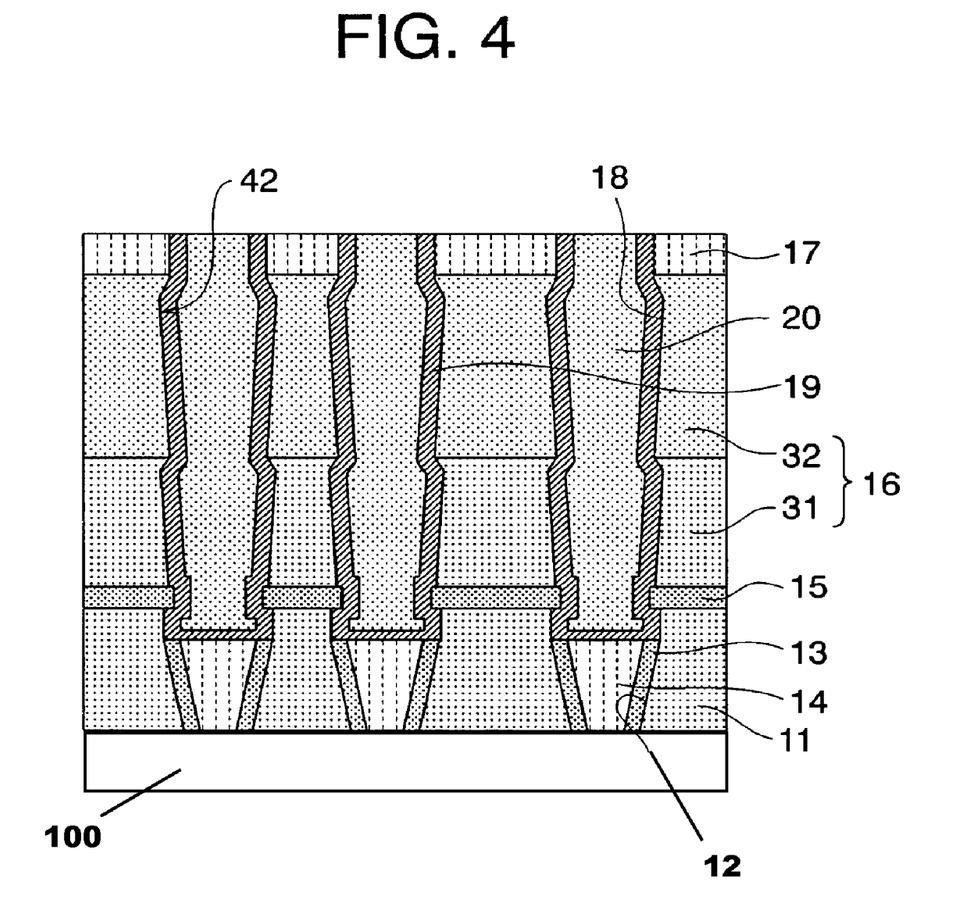
FIG. 4 is a vertical sectional view of a semiconductor device during a fabrication step of a process modified from the embodiment.

FIG. 4 is a sectional view showing a semiconductor device in a fabrication step of a process modified from the above embodiment. In this first modification, the capacitor-receiving film 16 has a two-layer structure wherein the lower layer 31 of the capacitor-receiving film 16 has a higher etch rate than the upper layer 32 thereof in a specific etching solution. For example, the lower layer 31 may be a general silicon oxide film such as a BPSG film, whereas the upper layer 32 may be a non-doped silicon oxide film deposited using a plasma-enhanced CVD process, for example.

It is to be noted that the process for forming the final cylindrical through-holes 18 includes etching of the sidewall of the initial cylindrical through-holes 18 by a significant amount, and may have a tendency to form a "bowing". The bowing is such that the cylindrical through-holes 18 have an increased diameter in the vicinity of the top portion thereof and a decreased diameter in the vicinity of the bottom. In the method of the first modification, the higher etch rate of the lower layer 31 and the lower etch rate of the upper layer 32 compensate the tendency to thereby prevent occurring of the bowing. In this example, a mixture of ammonia and hydrogen peroxide solution generally referred to as APM (Ammonia-Peroxide-Mixture) is used, to obtain a higher etch rate in the lower layer 31 and a lower etch rate in the upper layer 32. This etching step may be conducted after forming the cylindrical through-holes 18 in the capacitor-receiving film.

Figure 5A:
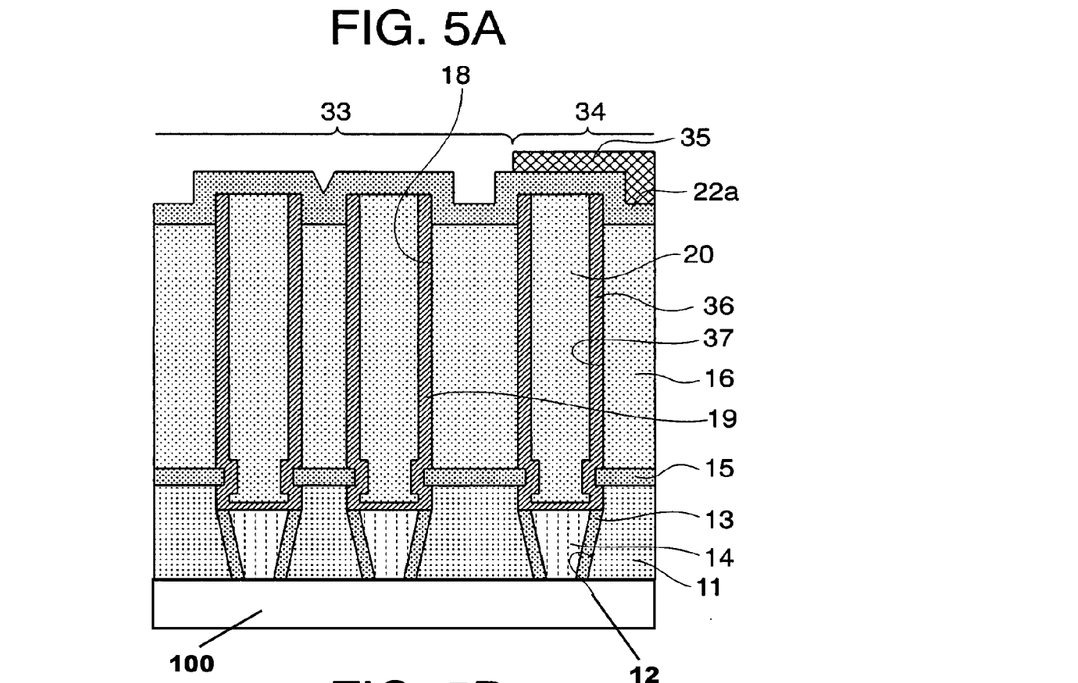
FIGS. 5A to 5C are sectional views showing consecutive steps of another process modified from the embodiment.
Figure 5B:
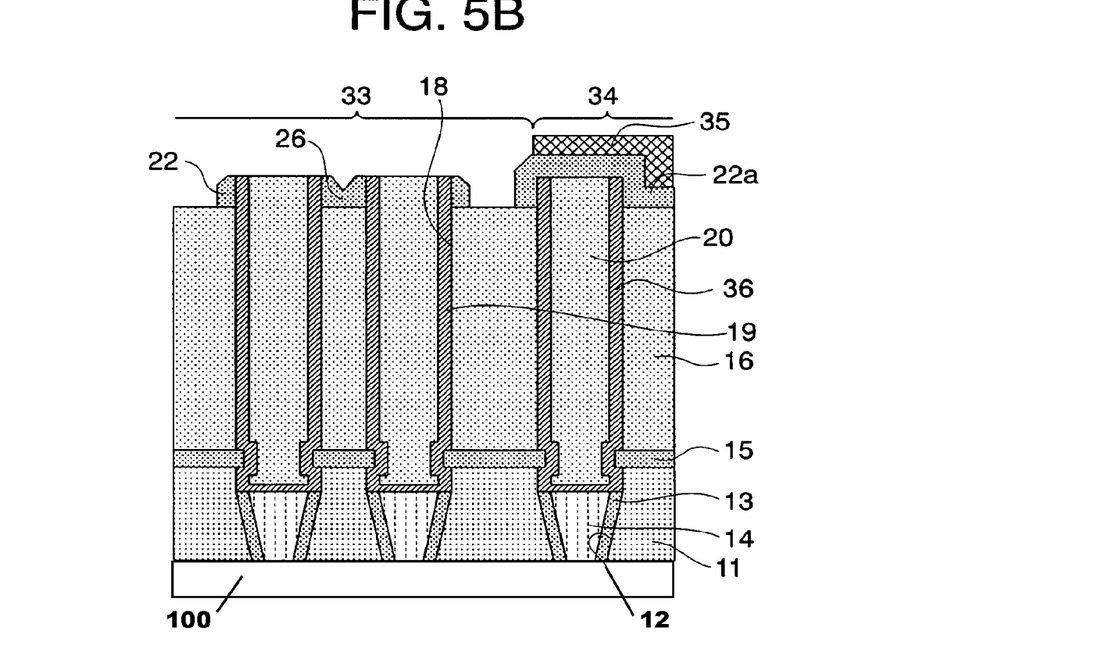

FIGS. 5A to 5C show a method according to a second modification of the above embodiment, depicting a memory cell array area 33 and a peripheral circuit area 34. In this modification, a dummy trench 37 is formed along the edge of the peripheral circuit area 34 near the boundary between the peripheral circuit area 34 and the memory cell array area 33, during the step of forming the cylindrical through-holes 18 such as shown in FIG. 3B. Following the step similar to the step of FIG. 3F, as shown in FIG. 5A, a resist mask 35 is formed on a portion of the insulating spacer film 22a formed in the peripheral circuit area 34. The dummy trench 37 receiving therein dummy bottom electrode 36 is covered by the resist mask 35 in the peripheral circuit area 34. During the etch-back of the insulating spacer film 22a in the step similar to the step of FIG. 3G, as shown in FIG. 5B, the insulating spacer film 22a is left in the peripheral circuit area 34 due to the presence of the resist mask 35, as shown in FIG. 5B.

Figure 6:
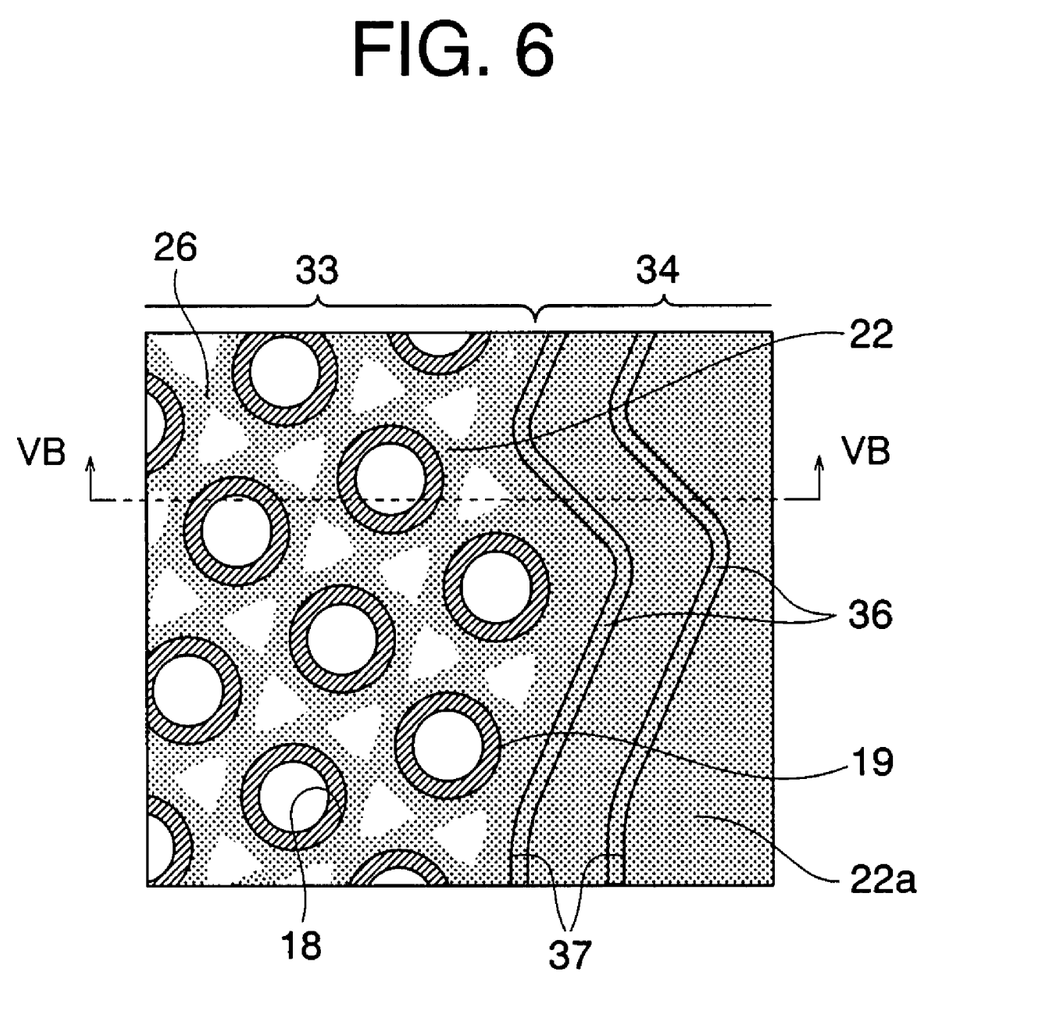
FIG. 6 is a top plan view showing the arrangement of bottom electrodes, dummy electrode and insulating spacers.

FIG. 6 shows a top plan view depicting the bottom electrodes 19, dummy bottom electrode 36, insulating spacers 22 and insulating spacer film 22a at the stage after patterning the insulating spacer film 22a. FIG. 5B corresponds to the section taken along line VB-VB in FIG. 6, wherein the dummy bottom electrode 36 appears as two stripes formed along both the sidewalls of the dummy trench 37. During the wet etching which follows the step of FIG. 5B to etch the capacitor-receiving film 16 and embedding film 20, the dummy bottom electrode 36 serves as a barrier for protecting a portion of the capacitor-receiving film 16 and embedding film 20 in the peripheral circuit area 34.

Figure 5C:
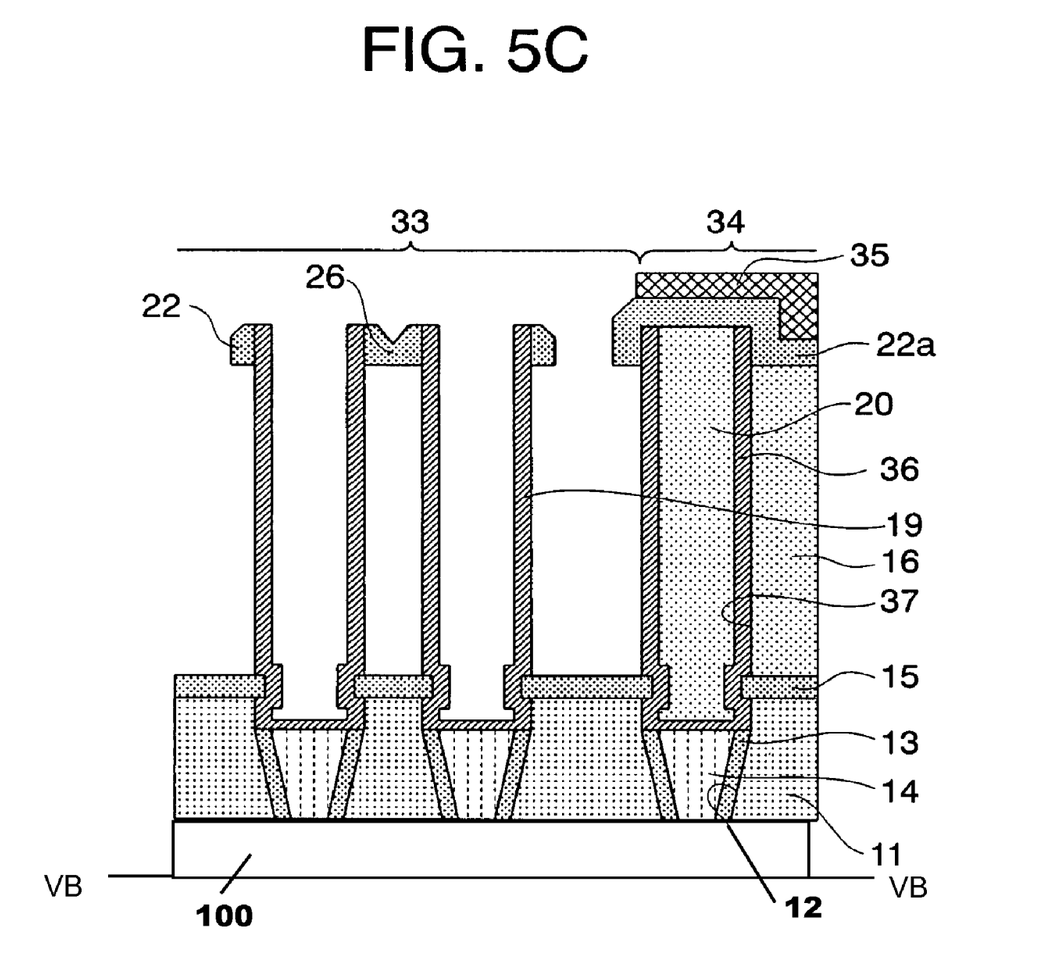

In the second modification, the insulating spacers 22 formed in the memory cell array area 33 are supported by the remaining portion of the insulating spacer film 22a in the peripheral circuit area 34. Therefore, the mechanical strength of the bottom electrodes 19 is improved further. Moreover, the level of the top surface can be made uniform between the memory cell array area 33 and the peripheral circuit area 34 due to the presence of the dummy bottom electrode 36 and insulating spacer film 22a remaining in the peripheral circuit area 34.

Figure 7A:
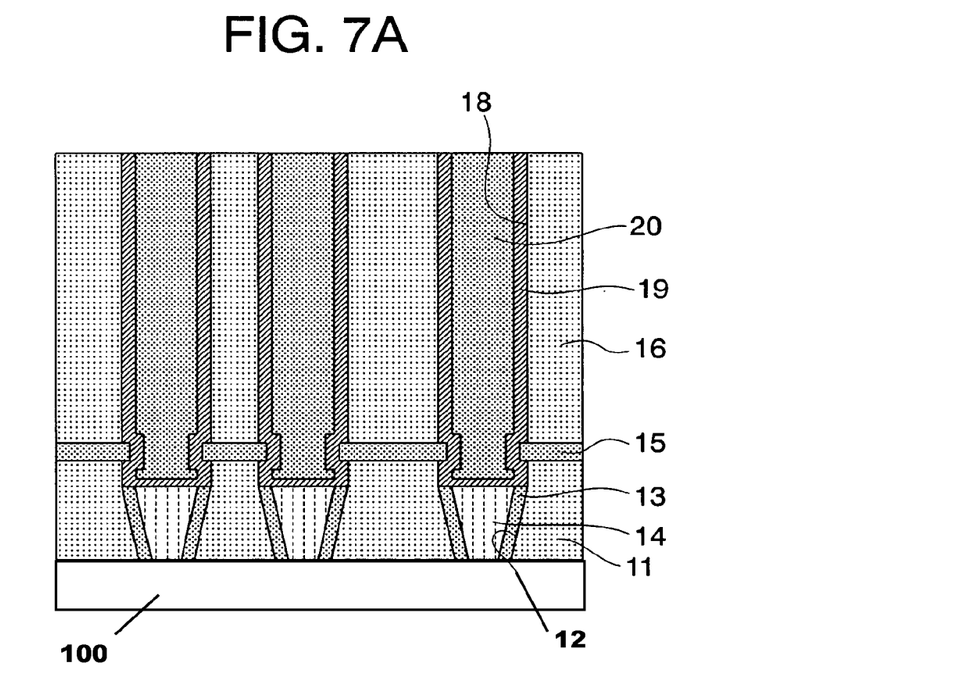
FIGS. 7A and 7B are vertical sectional views showing consecutive steps of a fabrication process of a comparative example.
Figure 7B:
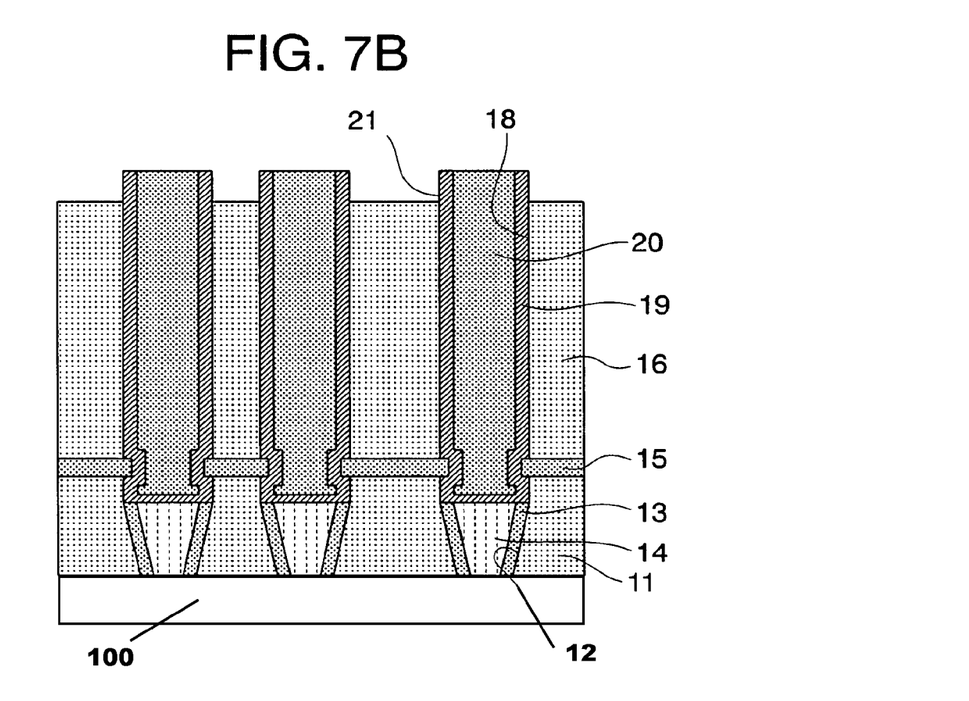

FIGS. 7A and 7B show a semiconductor device in consecutive steps of a process of a comparative example. The material for the capacitor-receiving film 16 used in this comparative example has a higher etch rate with respect to an etching solution including fluoric acid than the material for the bottom electrodes 19 and embedding film 20. Examples of such a combination of materials include BPSG (Boro-Phospho Silicate Glass) for the capacitor-receiving film 16, polysilicon or titanium nitride for the bottom electrodes 19, and NSG (Non-doped Silicate Grass) for the embedding film 20.

After forming the embedding film 20 in the cylindrical through-holes 18, the embedding film 20 is thermally annealed. This reduces the etch rate of the embedding film 20 with respect to the etching solution. After forming the embedding film 20, the bottom electrodes 19 deposited on the hard mask 17, the embedding film 20 and the surface portion of the hard mask are removed as by etch-back thereof. This provides bottom electrodes 19 separated from the bottom electrode film 19a, as shown in FIG. 7A.

Subsequently, wet etching using an etching solution including low-concentration fluoric acid is conducted to form a step 21 between the capacitor-receiving film 16 and the bottom electrodes 19 or the embedding film 20, as shown in FIG. 7B, by using the etch rate difference therebetween. The succeeding steps are similar to the steps shown in FIGS. 3F, 3G, 3H etc. in the above embodiment.

In the process of the comparative example, the step 21 is formed by using the etch rate difference between the capacitor-receiving film 16 and the bottom electrodes 19 or the embedding film 20. This process, however, uses a material having a lower etch resistance for the capacitor-receiving film 16, which incurs a larger bowing in the cylindrical holes 18. In addition, such a process may also incur a short-circuit failure between adjacent capacitors due to the collapse of a portion of the cylindrical through-holes 16 adjacent to the cylindrical through-holes 18.

The first modification of the above embodiment may use a silicon oxide film such as BPSG for the lower layer, as described before, wherein the BPSG may include an increased amount of dopant such as phosphor or boron, if it is desired that the lower layer of the capacitor-receiving film have a higher etch rate than the upper layer thereof On the other hand, in the comparative example, the increased amount of dopant, if employed, for obtaining a larger etch rate may incur local agglomeration of the dopant in the film due to the excessive impurity concentration, thereby restricting the process for the semiconductor device. In addition, the annealing temperature for the embedding film may be restricted depending on the material for the bottom electrodes 19. Accordingly, the embodiment uses removal of the hard mask 17 without using the etch rate difference between the capacitor-receiving film 16 and the embedding film 20.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined in the claims. For example, although the capacitors have a shape of cylinder having a circular cross section in the above embodiment and modifications, the capacitors need not have a shape of cylinder having a circular shape.

What is claimed is:

1. A method for manufacturing a semiconductor device comprising:
   forming a first insulating film overlying a semiconductor substrate;
   forming a mask pattern on said first insulating film;
   anisotropic-etching said first insulating film by using said mask pattern as an etching mask, to form a plurality of through-holes in said first insulating film;
   depositing a bottom electrode film on bottom and sidewall of said plurality of through-holes and on top of said mask pattern;
   depositing a second insulating film on said bottom electrode film to fill said plurality of through-holes, said second insulating film having a substantially flat surface;
   removing a top portion of said bottom electrode film and said second insulating film, to thereby separate said bottom electrode film into a plurality of bottom electrodes;
   removing said mask pattern to form a level difference between said first insulating film and a top of said plurality of bottom electrodes or said second insulating film;
   depositing a third insulating film covering said first insulating film, said second insulating film and said plurality of bottom electrodes;
   etching-back said third insulating film to leave a plurality of insulating spacers encircling the outer side of respective said bottom electrodes;
   removing said first and second insulating films; and
   depositing a capacitor insulation film and a top electrode film on said bottom electrodes and said plurality of insulating spacers to form a plurality of capacitors.

2. The method according to claim 1, wherein said mask pattern includes polysilicon or amorphous carbon.

3. The method according to claim 1, wherein a thickness of said mask pattern after the step of removing said mask pattern to form a level difference is larger than the gap between adjacent through-holes.

4. The method according to claim 1, wherein said etching-back additionally leaves a bridge portion bridging two of said plurality of insulating spacers.

5. The method according to claim 1, wherein said first insulating film includes an upper insulating film and a lower insulating film, said lower insulating film having a higher etch rate than said upper insulating film.

6. The method according to claim 1, wherein said anisotropic-etching forms a dummy trench in said first insulating film, said dummy trench dividing an area of said first insulating film into a first area including therein said through-holes and a second area including therein no said through-holes, and said etching-back of said third insulating film is prevented on said second area.

7. The method according to claim 1, wherein said plurality of through-holes have a shape of cylinder.

* * * * *